United States Patent
Oshino

(10) Patent No.: US 6,218,674 B1
(45) Date of Patent: Apr. 17, 2001

(54) ELECTRON BEAM PROJECTION EXPOSURE APPARATUS

(75) Inventor: Tetsuya Oshino, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/151,931

(22) Filed: Sep. 11, 1998

(30) Foreign Application Priority Data

Sep. 12, 1997 (JP) .................................................. 9-249016

(51) Int. Cl.⁷ ...................................................... H01J 37/30
(52) U.S. Cl. ......................................... 250/492.2; 430/426
(58) Field of Search ................................. 250/492.2, 398, 250/491.1, 492.24; 430/246

(56) References Cited

U.S. PATENT DOCUMENTS

| | | | |
|---|---|---|---|
| 4,855,605 | * 8/1989 | Schroeter | 250/492.1 |
| 5,279,925 | * 1/1994 | Berger et al. | 430/246 |
| 5,508,518 | * 4/1996 | Kendall | 250/492.2 |
| 6,002,987 | * 12/1999 | Kamiya et al. | 250/492.2 |
| 6,008,144 | * 12/1999 | Shih et al. | 250/492.2 |

* cited by examiner

*Primary Examiner*—Bruce C. Anderson
(74) *Attorney, Agent, or Firm*—Anderson, Kill & Olick P.C.

(57) ABSTRACT

The electron beam projection exposure apparatus of the present invention reduces the incidence of defects in patterns formed by exposure on a substrate and includes an illumination optical system for generating an electron beam, a mask placed in a prescribed location including a mask stage for aligning and scanning the mask, a projection-imaging optical system for projecting an image of a pattern formed on the mask onto a substrate with the substrate including a substrate stage for positioning and scanning the substrate. The electron beam projection exposure apparatus further includes at least one filter placed in the proximity of the mask for filtering dust and for preventing dust particles from inhibiting the passage of the electron beam to said substrate.

12 Claims, 5 Drawing Sheets

ELECTRON BEAM PROJECTION EXPOSURE APPARATUS

FIELD OF THE INVENTION

The present invention relates to an electron beam projection exposure apparatus that uses electron beam optics to project the circuit patterns of masks or reticles (hereinafter referred to as masks) onto semiconductor substrates such as a wafer etc.

BACKGROUND OF THE INVENTION

Projection exposure systems are used in semiconductor fabrication to transfer a circuit pattern formed on the surface of a mask (the objective plane), through imaging optics, onto a substrate, e.g. a wafer coated with resist. Exposing this resist with the projected image of the circuit pattern forms a latent image of the circuit pattern in the resist.

The major advantage of electron beam exposure, in which an electron beam is used to form this pattern instead of a projected light beam, is that the size of the electron beam can be reduced to just a few Angstroms, if desired, to form fine patterns as small as 1 µm or less.

One of the electron beam exposure techniques used in the past was the direct write technique. In the direct write technique, fine patterns are formed by scanning a converged electron beam within very minute areas that are actually smaller than the line width of the pattern to be written.

The problem with the direct write electron beam exposure technique is that it is too slow to be used where high throughput is required. Another technique, however, is electron beam projection exposure, in which a circuit pattern formed on a mask is projection-transferred to a substrate. Electron beam projection exposure is capable of higher throughput than can be obtained with conventional direct write techniques.

A simplified schematic representation of a prior art electron beam projection exposure apparatus is shown in FIG. 1 which comprises:

a mask (2) stage, a conventional illumination optical system (1) which consists of an electron gun and optics (not shown) for illuminating the mask (2) with an electron beam (7) emitted from the electron gun and a projection-imaging optical system (3) for projecting an electron beam (7a) which is transmitted by or passed through the mask (2) onto a substrate (4).

The electron beam 7, emitted from the illumination optical system 1, illuminates the mask 2, and the electron beam 7a, transmitted by or passed through the mask 2, passes through the projection-imaging optical system 3 forming electron beam 7b which illuminates the substrate 4. The substrate 4 might be, for example, a resist-coated silicon wafer. The electron beam 7b incident upon this substrate 4 modifies the resist, leaving it either more soluble (positive resist) or less soluble (negative resist) in the developer. Stated otherwise, the projection-imaging optical system 3 projects a reduced image of the circuit pattern of the mask 2 onto the substrate 4, which results in a fine circuit pattern being exposed in the resist on the substrate 4.

However, due to optical constraints of the projection-imaging optical system 3, high resolution can be obtained only in a small area (e.g. approximately 1 mm$^2$). Since the size of a semiconductor chip is on the order of 20 mm$^2$, it is not possible to expose the entire chip at once. Therefore, in a conventional prior art electron beam projection exposure systems in order to expose the desired area of the mask, the electron beam 7 is directed at a selected portion of the mask (pattern portion) and is also scanned as required to expose the desired pattern portion area.

In addition to scanning the electron beam, the mask may also be scanned. To do this, the mask may be scanned by a mask stage scanning mechanism. This may be accomplished, for example, by scanning the electron beam along one axis and the mask along another intersecting axis, thus providing a large exposure field.

The pattern portion of a mask for electron beam projection exposure might consist, for example, of a membrane. Since such membranes have low mechanical strength, they are usually supported at the outer edges by retention members.

FIG. 2 is an enlarged view of a pattern portion 21 of a mask 2. The pattern portion 21 might be formed, for example, by making multiple through-holes 8 in the mask within the designated portion 21 in the shape of a pattern. When this has been done, one electron beam ray 14 which is directed at a through-hole 8 in the pattern portion 21 will pass through the through hole 8, whereas another electron beam ray 15 which is not directed at a through hole 8 i.e., is directed at another portion on the pattern portion 21 of the mask will either be scattered, or absorbed.

Electron beams that pass through the through-holes 8 are formed into an image at the substrate 4 of the mask circuit pattern by the projection-imaging optical system 3. If there is a minute dust particle 22 on the surface of the membrane such as a minute particle of dust 22 located at a through-hole 8 it may serve to block an electron beam ray 16 directed toward that through-hole and end up being absorbed or scattered by the dust particle 22. When this occurs, the pattern will often not be faithfully transferred to the substrate in areas where through-holes are blocked by dust. For this reason, such prior electron beam projection exposure systems have a problem in that circuit patterns from exposures using such systems tend to have many defects.

Although there are mask cleaning methods to mitigate this problem, most prior cleaning methods involve cleaning the mask before it is mounted in the electron beam projection exposure system and dust which collects on the mask between cleaning and mounting still result in defects in the patterns formed by the system.

Even when the mask is cleaned just prior to loading it in the system there is still a problem in that dust particles inside the exposure system adhere to the mask, and as the exposure time increases, the defect density also increases.

It is an objective of the present invention to provide an electron beam projection exposure apparatus in which accumulation of dust particles adhering to the mask can be prevented, thus reducing defects in circuit patterns formed on substrates through exposures made with the mask.

SUMMARY OF THE INVENTION

The electron beam projection exposure apparatus of the present invention comprises:

an illumination optical system for generating an electron beam, a mask;

a mask stage for aligning and scanning said mask relative to said electron beam;

a substrate;

a projection-imaging optical system in alignment with said mask for transferring the image of a pattern formed upon said mask by said electron beam to said substrate;

a substrate stage for said substrate; and at least one filter located in the proximity of said mask for filtering dust and for preventing dust particles from inhibiting the passage of the electron beam to said substrate.

DESCRIPTION OF THE PREFERRED EMBODIMENTS

In the electron beam projection exposure apparatus of the present invention dust is prevented from inhibiting the passage of the electron beam through the apparatus by placing a filter in the proximity of the mask. That is, in the electron beam projection exposure apparatus of the present invention, even if, for example, dust around the outside of the mask should float toward the mask, it would be trapped by the filter before it reaches the mask. Thus, once it is mounted in the apparatus, dust particles can be prevented from adhering to the mask even throughout repeated or lengthy exposures. Furthermore, according to the electron beam projection exposure apparatus of the present invention, dust is prevented from collecting on the mask, and as a result of this, defects in patterns formed on a substrate by exposures using the mask can be prevented.

Figure 1:
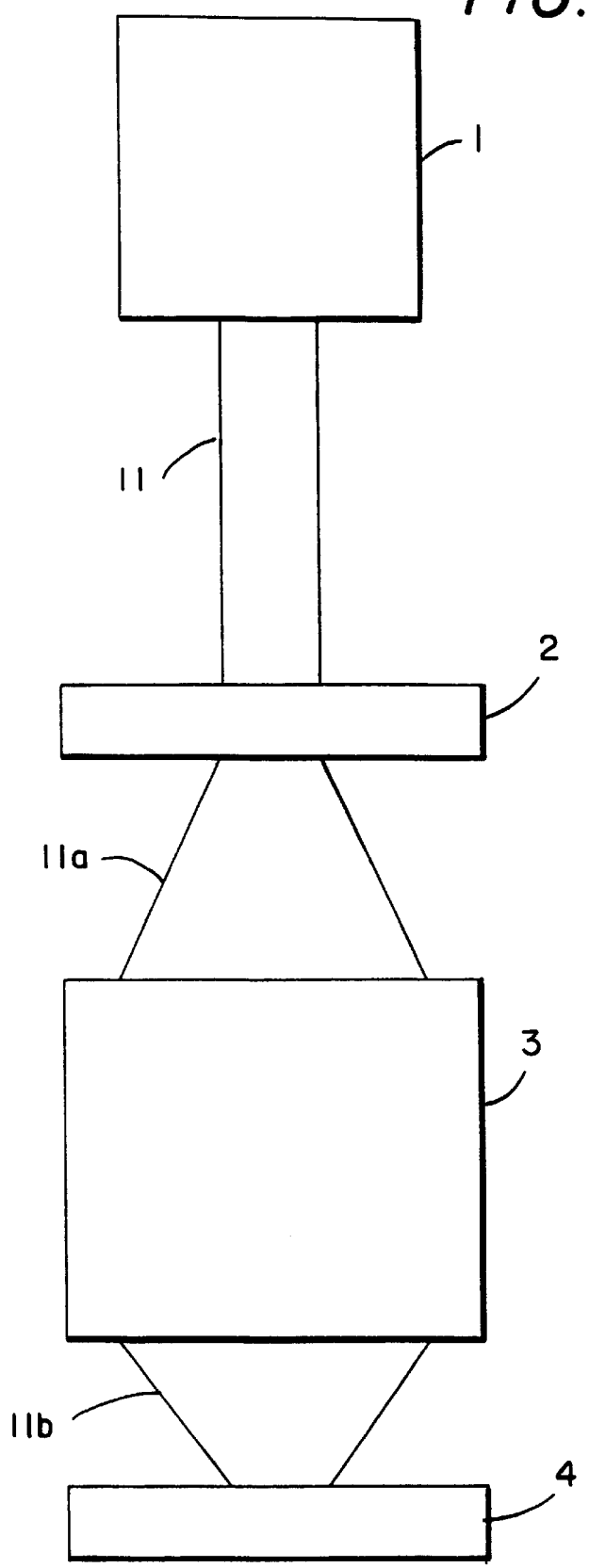
FIG. 1 shows a simplified schematic drawing of a prior art electron beam projection exposure apparatus.
Figure 2:
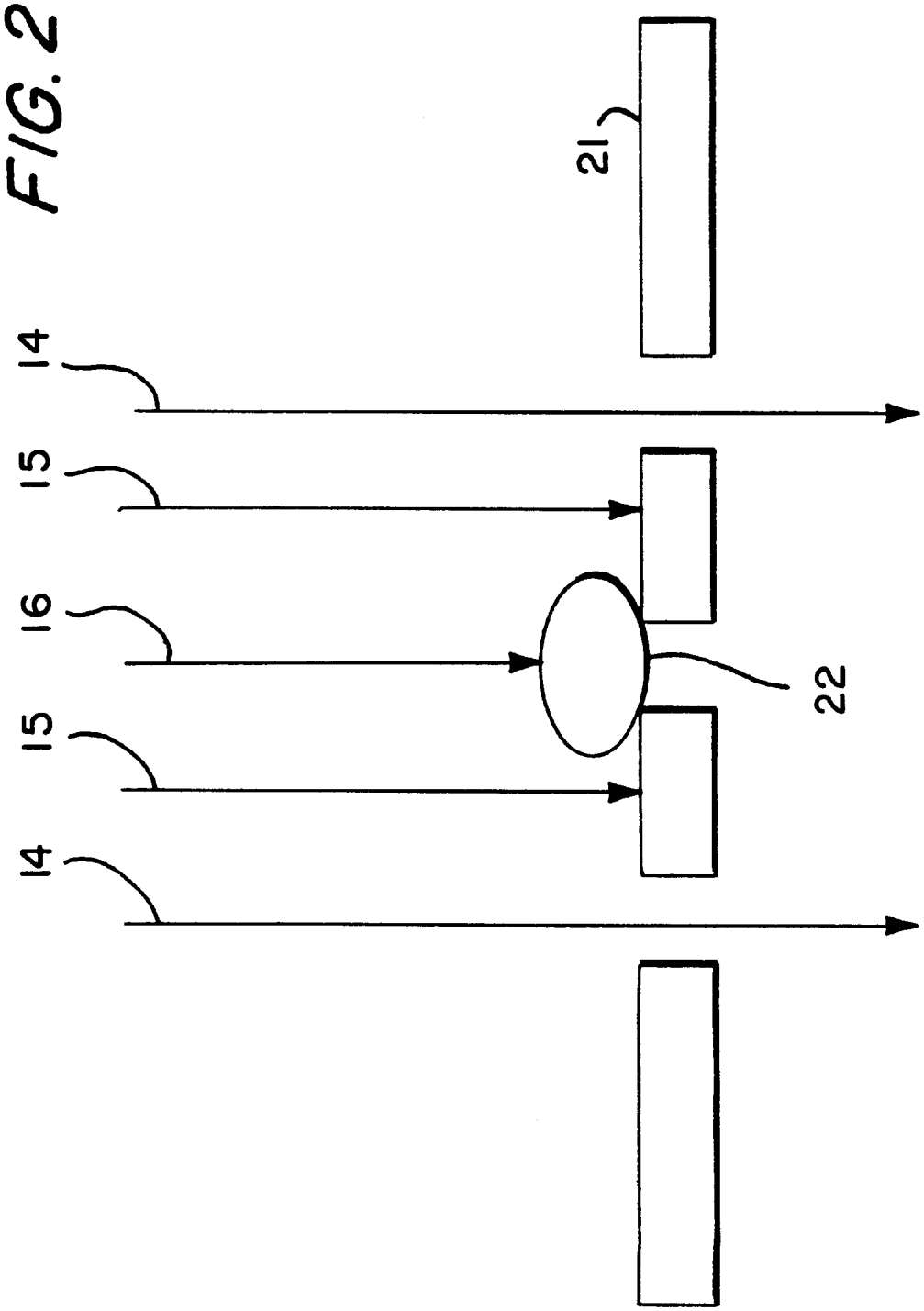
FIG. 2 shows an enlarged cross-section view of the pattern portion of a mask being partially blocked by a dust particle in the prior art electron beam projection exposure apparatus of FIG. 1.
Figure 3:
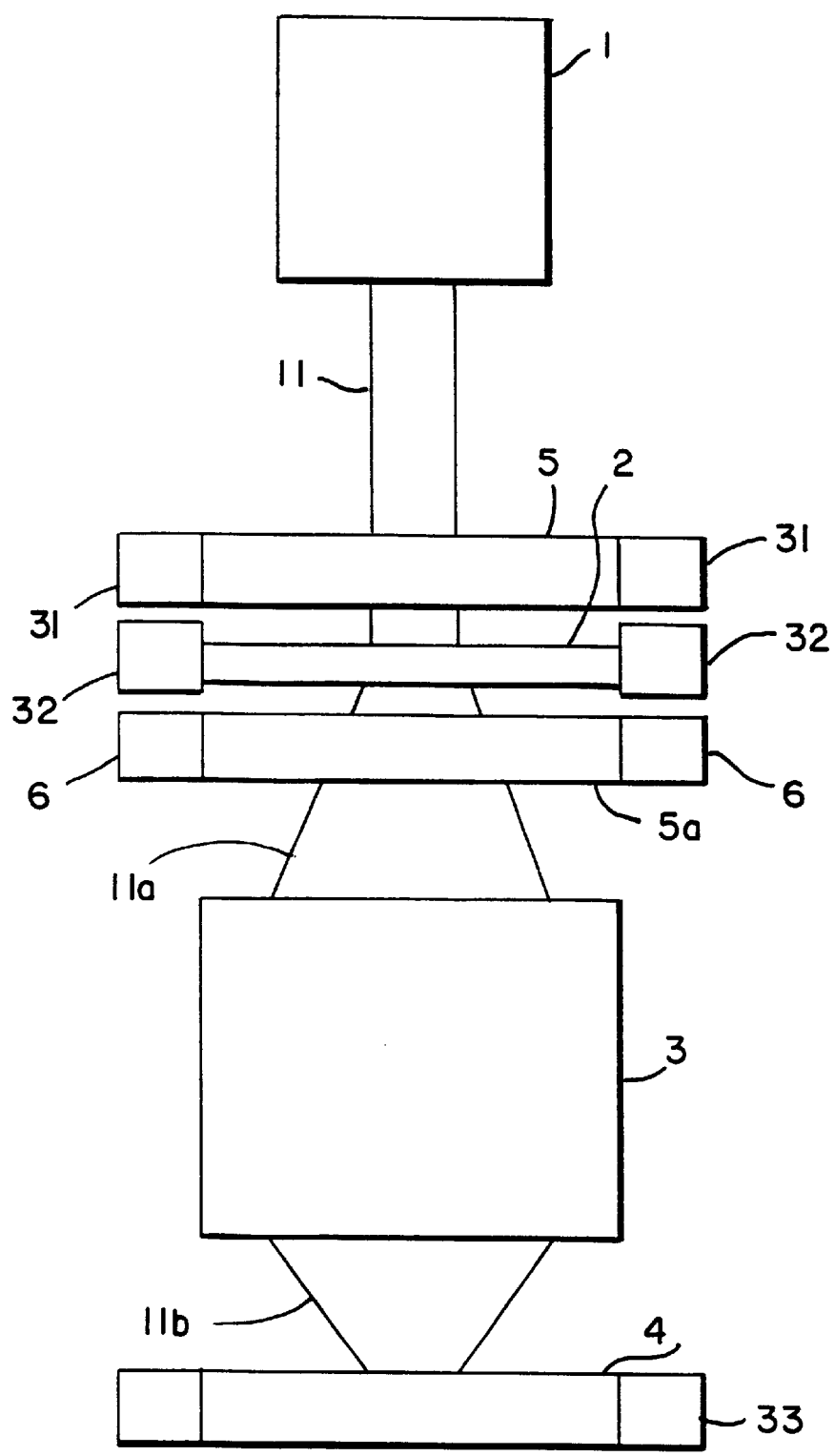
FIG. 3 shows a simplified schematic drawing of the electron beam projection exposure apparatus of the present invention.

FIG. 3 is a simplified schematic drawing showing an example of the electron beam projection apparatus 10 of the present invention. The electron beam projection exposure apparatus 10 includes a conventional electron beam illumination optical system 1 which consists of an electron gun and optics (not shown) necessary for illuminating a mask 2 with an electron beam 11 emitted from the electron gun, an optional scanning stage 32 for holding and scanning the mask 2 preferably in synchronism with the scanning of electron beam, a projection-imaging optical system 3, a substrate 4 and another scanning stage for the substrate 4 which scans the substrate as the electron beam and mask 2 are scanned. The electron beam 11 emerging from the mask 2 is identified as 11a and the electron beam emerging from the projection-imaging optical system 3 is identified as 11b. In addition the electron beam projection exposure apparatus 10 includes a first filter 5 and, optionally, a second filter 5a which can be identical in construction to the first filter 5. In the arrangement shown in FIG. 4 the first filter 5 is located adjacent the mask 2 between the mask 2 and the illumination optical system 1 whereas the second filter 5a lies adjacent the mask 2 between the mask 2 and the projection-imaging optical system 3. A scanning stage 6 is used to hold and scan the lower filter 5a.

The mask 2 has a pattern formed on it by the electron beam 11 generated from the illumination optical system. The electron beam 11 illuminates a desired minute area of the mask 2 to form the pattern at a 1:1 magnification or greater. Thus the electron beam 11a may be enlarged when passing through the projection-imaging optical system 3. However, the projection-imaging optical system 3 can provide an enlarged or reduced image when exposing the substrate 4 with the electron beam 11b to provide an image of 1:1 or reduced magnification of the circuit pattern of the mask 2.

To perform an exposure, the electron beams 11, 11a and 11b are scanned and if desired, the mask 2 and substrate 4 are also synchronously scanned as required to expose the image over a prescribed area of the mask 2 on the substrate 4.

If a filter 5 is placed between the illumination optical system 1 and the mask 2, dust can be kept off the upper end surface (as shown in FIG. 3) of the mask 2 facing the filter 5. If the lower filter 5a is placed between the mask 2 and the imaging optical system 3, dust can be kept off the lower end surface of the mask 2. It is preferable, to provide a filter in each of these locations. By doing this, a marked reduction in the incidence of dust particles adhering to the mask 2 will result.

Any filter geometry may be used which will be effective to prevent dust from adhering to the mask 2. For example, the filter(s) 5 and 5a could be in the form of a flat plate of the same size or larger than the mask 2, placed adjacent to the mask and parallel to the mask surface.

The upper filter 5a is located in proximity to the mask 2 and is separated therefrom by an offset distance which at a minimum is equal to and preferably greater than the focal depth on the mask side of the projection optics (projection imaging optical system 3). If the offset distance is not at least equal to the focal depth, dust particles on the filter can be imaged onto the substrate by the projection optics which would defeat the objectives of this invention. As the focal depth depends on the N.A. (Numerical Aperture) and wavelength of the projection optics, the minimum offset distance differs depending on a property of the projection optics. As a practical matter the minimum offset distance is a least one millimeter. If the space between the filter 5 and the mask surface is too small, which in extreme cases, would mean that the filter 5 is touching the surface of the mask, dust on the filter will be in essentially the same location as the mask surface. This is undesirable because an image of the dust would then be projected onto the substrate 4 by the projection-imaging optical system 3. Accordingly, the distance between the mask and the filter should be made greater than the depth of focus at the mask end of the projection-imaging optical system. When the space between the filter 5 and the mask 2 is larger than the depth of focus at the mask end of the projection-imaging optical system than even if dust is present on the filter 5, the dust will be out of focus and thus, a projected image of the dust will not be formed on the substrate 4, and it will therefore not cause pattern defects.

As described above, in order to improve the effectiveness of the filter 5 in keeping dust off the mask 2, it is preferable that the filter be made in the form of a flat plate of the same size or larger than the mask. When this is done, however, the electron beam used for electron beam projection exposure will also be incident upon filter 5.

Figure 4:
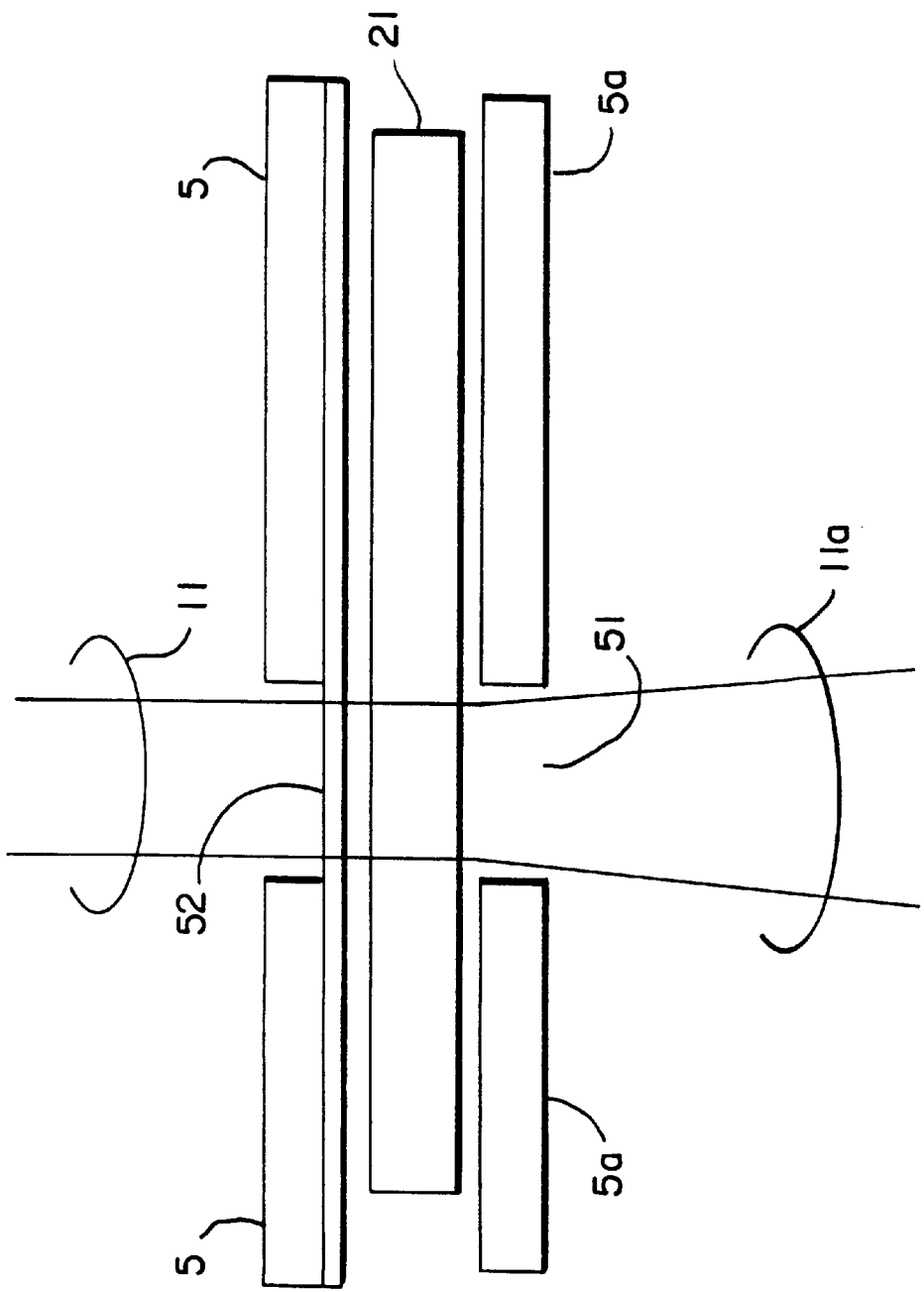
FIG. 4 shows an enlarged cross-section view of the a mask and filter arrangement for the electron beam projection exposure apparatus of FIG. 3.
Figure 5A:
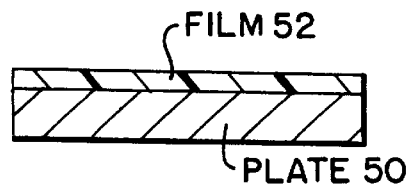
FIGS. 5a and 5b are cross-sectional views of the assembly of a filter in accordance with one embodiment of the present invention.
Figure 5B:
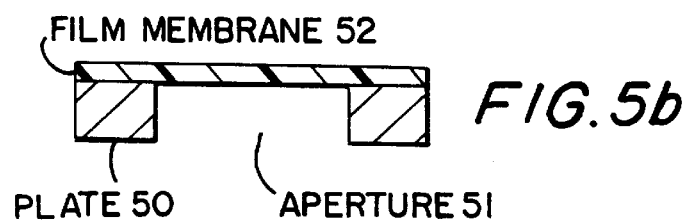
Figure 6:
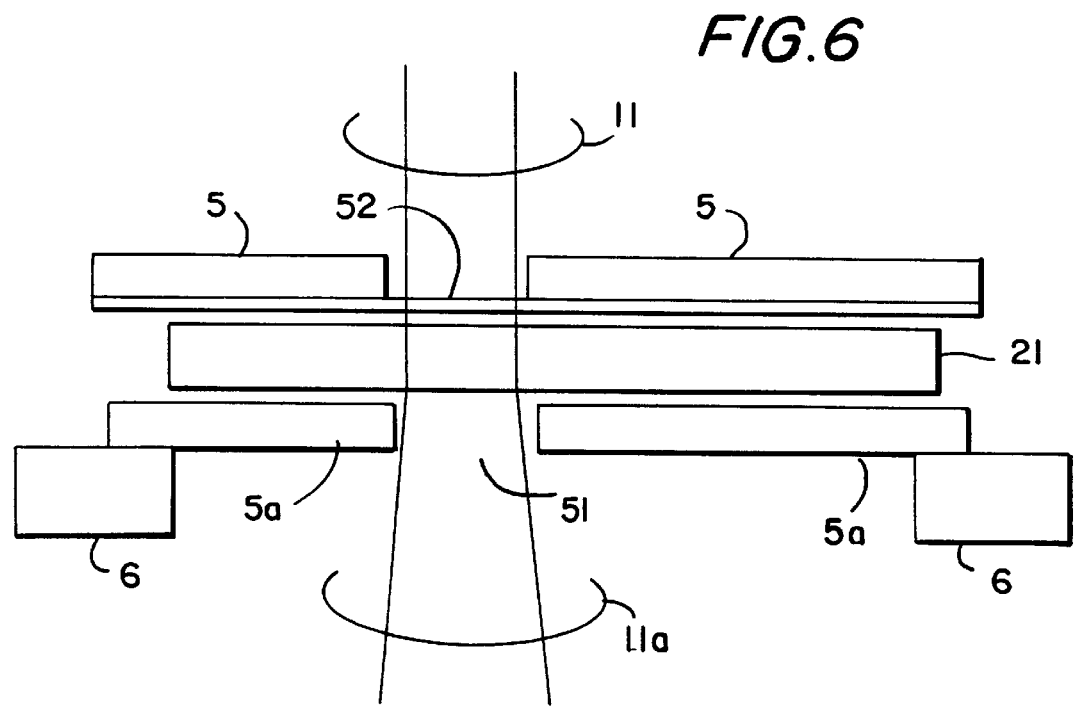
FIG. 6 is a view similar to FIG. 4 showing an additional scanning stage for one of the filters adjacent the substrate.

The filter 5 and 5a should be constructed to avoid attenuating the electron beam. Accordingly, it is preferable for the filter to have a portion for transmitting or passing the electron beam which may either be a through-hole for passing the electron beam or a membrane for transmitting said electron beam. The preferred construction of the filter 5 involves coating a thin film membrane 52 on a flat plate 50 as shown in FIGS. 5a and 5b respectively. The membrane should be sized so that an electron beam can pass therethrough. The flat plate 50 provides mechanical strength and support for the thin film membrane 52. An aperture or pin-hole 51 is formed in the plate to expose the membrane 52 such as by etching a backside of the plate 50. A plurality of such apertures are formed over a designated surface area of the plate 50 to form the pattern portion 21 in FIG. 4. Although the lower filter 5a may also be constructed in this fashion it is preferable to form the lower filter 5a only with a plurality of through hole apertures (pin-holes) 51 in a desired pattern. In the preferred arrangement as shown in FIG. 4 the upper filter 5 contains the thin film membrane 52 exposed by a plurality of apertures 51 formed as shown in FIGS. 5a and 5b and the lower filter 5a, which is optional, preferably includes a plurality of pin-holes extending through the plate without a membrane coating. Since dust particles will adhere to the upper side of the mask more easily than the lower side of the mask the filter 5 containing a membrane 52 is preferably placed above the mask. Moreover, the filter 5 containing a membrane 52 can prevent dust particles from adhering to the mask more efficiently than the filter containing through holes.

The size i.e., surface area of the exposed membrane 52 in the filter 5 should be much bigger than a typical dust particle and may be of a size of, for example, 2 mm×2 mm whereas the electron beam will be 1 mm×1 mm or less. However, the membrane 52 should be very thin with a high transmissivity to transmit the electron beam with little or no attenuation.

In addition, it is preferred for the membrane 52 to be made of material through which it is easy for the electron beam to pass, because it will then have an even higher transmissivity for the electron beam. For such materials through which it is easy for the electron beam to pass, the light elements or compounds thereof may be used. The preferred materials include, for example, materials such as silicon, carbon, boron, silicon nitride, silicon oxide, silicon carbide, boron carbide, and boron nitride.

When the filter 5 has a membrane 52 for passing the electron beam, the incidence of dust particles adhering to the mask 2 is reduced to an even lower level than when the filter 5 has a through-hole 51 for passing the electron beam. The membrane 52 in the filter 5 is supported by the support plate 50 to prevent rupturing or warping.

When the exposure apparatus of the present invention is used to perform exposures using a continuous scan electron beam, it is preferable to make the through-hole 51 or membrane 52 in each filter 5 and 5a of a size the same as the scanned area. This will prevent the electron beam from being attenuated by illuminating low transmissivity portions of the filter (portions other than the through-hole or membrane).

When the exposure apparatus of the present invention is used to perform exposures using a non-continuous-scan electron beam, it is preferable to provide through-holes or membranes in a plurality of locations on the filter such that the scanned electron beam will pass through or be transmitted by the through-holes or membranes.

When a plurality of electron beams are incident to the mask as well, it is preferable to provide membranes in a plurality of locations on the filter such that each electron beam will pass through or be transmitted by a through-hole or membrane.

As shown in FIG. 3, a scanning stage 31 may also be provided for the filter 5. When this configuration is used, the position of the through-hole or membrane through which the electron beam 11 is passing (or being transmitted) can be moved so as to track the position of the location on the mask being illuminated by the electron beam 11.

In this configuration, the size of the through-hole or membrane can be made about as small as the electron beam. This configuration is desirable because of its effectiveness in keeping dust off the mask, especially when the filter uses a through-hole.

The following are illustrative working examples of the invention:

Example 1

The electron beam projection exposure apparatus of FIG. 3 comprises:
an electron beam illumination optical system 1, a mask 2, a scanning stage 32 for the mask 2, an electron beam projection-imaging optical system 3,
a substrate 4 and scanning stage 33 for the substrare 4, an upper filter 5 and scanning stage 31 for the upper filter 5 and a lower filter 5a and scanning stage 6 for the lower filter 5a.

Formed on the mask 2 is a 4× enlarged pattern to be transferred to the substrate. The pattern portion of the mask consists of a silicon membrane with through-holes formed therein in the shape of the pattern.

The electron beam illumination optical system 1 includes an electron gun and an electron lens (not shown) for illuminating the mask with the electron beam from the electron gun. The electron beam illumination optical system 1 causes the electron beam 11 to illuminate a portion of the mask 2.

The projection-imaging optical system 3 causes the electron beam that has passed through the mask 2 to illuminate the substrate 4 resulting in a reduced image of the circuit pattern on the mask 2 being formed on the substrate 4. The substrate 4 is coated with resist. The portion of the photosensitive resist that is illuminated by the electron beam is modified by the beam to form a latent image of the pattern in the resist.

During the exposure process, the electron beams 11, 11a and 11b are scanned, and the mask 2 and substrate 4 are also synchronously scanned, to expose an image of a prescribed area of the mask 2 pattern on the substrate 4. This transfers the pattern to the substrate.

Filter 5 is placed adjacent to the mask 2 between the illumination optical system 1 and the mask 2, and filter 5a is palced adjacent the mask 2 between the mask 2 and the projection-imaging optical system 3. Filter 5 between the illumination optical system 1 and the mask 2 was made from a 3-mm thick silicon plate, and a $0.1/\mu$m-thick silicon nitride membrane 52. The planar shape of the membrane was made substantially rectangular (2 mm×10 mm). Filter 5a, between the mask 2 and the projection-imaging optical system 3, consists of a 1 mm-thick stainless steel plate with a rectangular hole 51 formed in it. The hole 51 is a substantially rectangular hole, 2×10 mm in size.

When exposures were performed using the electron beam projection exposure apparatus of this example, the resulting resist patterns had almost no defects, thus providing high yield semiconductor pattern fabrication. In addition, continuation of exposures over a long period of time resulted in almost no change in yield.

On the other hand, when exposures were performed using prior electron beam projection exposure apparatus, a large number of resist pattern defects occurred. This led to reduced yield in semiconductor pattern fabrication. In long term exposures, in particular, there was an even greater reduction in yield.

Finally, exposures were interrupted long enough for the reticle to be removed from the apparatus for cleaning. After reticle cleaning, the yield went back up, but only to decrease again, as expected, after performing lengthy exposures.

Example 2

The basic configuration of the electron beam projection exposure apparatus in this example is the same as in the first example, but part of the configuration is different. In the apparatus of this example, filters 5 and 5a are provided adjacent to the mask, with filter 5 located between the illumination optical system 1 and the mask 2, and filter 5a located between the mask 2 and the projection-imaging optical system 3. In this example, however, filter 5 was made from a 3-mm thick silicon plate, and a 0.1/μm-thick silicon nitride membrane 52. The plan view shape of the membrane was made substantially rectangular, 2×2 mm in size and filter 5a was made by cutting a rectangular hole 51 in a 1 mm-thick stainless steel sheet. The shape of the opening 51 was made substantially rectangular, 2×2 mm in size.

During exposure, the lower filter 5a is moved by a scan stage 6 along with the scanning of the electron beam, such that the electron beam is transmitted by and passed through the membrane 52 and through-hole 51 of the filters.

When exposures were performed using the electron beam projection exposure apparatus of this example, the resulting resist patterns had almost no defects, which in turn resulted in high yield semiconductor pattern fabrication. In addition, continuation of exposures over a long period of time resulted in almost no change in yield.

On the other hand, when exposures were performed using a prior electron beam projection exposure apparatus, a large number of resist pattern defects occurred. This led to reduced yields during semiconductor pattern fabrication. In long term exposures, in particular, there was an even greater reduction in yield.

Finally, exposures were interrupted long enough for the reticle to be removed from the apparatus for cleaning. After reticle cleaning, the yield went back up, but only to decrease again, as expected, after performing lengthy exposures.

As described above, with the electron beam projection exposure apparatus of the present invention, it is possible to prevent dust from adhering to the mask, and consequently, to reduce the incidence of defects in patterns formed on substrates by exposure.

What is claimed is:

1. An electron beam projection exposure apparatus comprising:
   an illumination optical system for generating an electron beam,
   a mask,
   a mask stage for aligning and scanning said mask relative to said electron beam;
   a substrate;
   a projection-imaging optical system in alignment with said mask for transferring the image of a pattern formed upon said mask by said electron beam to said substrate;
   a substrate stage for said substrate; and
   at least one filter located in the proximity of said mask for filtering dust and for preventing dust particles from inhibiting the passage of the electron beam to said substrate said filter being disposed between said illumination optical system and said projection imaging optical system.

2. An electron beam projection exposure apparatus as recited in claim 1, wherein said filter is located between said illumination optical system and said mask.

3. An electron beam projection exposure apparatus as recited in claim 2, wherein said filter includes a membrane with high transmissivity for transmitting said electron beam therethrough.

4. An electron beam projection exposure apparatus as recited in claim 1, wherein said filter is located between said mask and said projection-imaging optical system.

5. An electron beam projection exposure apparatus as recited in claim 4, wherein said filter has a through-hole for passing the electron beam therethrough.

6. An electron beam projection exposure apparatus as recited in claim 1, comprising a first filter placed between said illumination optical system and said mask and a second filter placed between said mask and said projection-imaging optical system.

7. An electron beam projection exposure apparatus as recited in claim 6, wherein said first filter includes a membrane for transmitting said electron beam therethrough before passing through said mask and wherein said second filter includes a through-hole for passing the electron beam emerging from said mask onto said projection-imaging optical system.

8. An electron beam projection exposure apparatus as recited in claim 7, wherein said first filter is constructed from a flat planar member and a superimposed thin membrane having at least one aperature extending through the flat planar member for forming an exposed membrane of predetermined size through which the electron beam is passed.

9. An electron beam projection exposure apparatus as recited in claim 8 wherein said membrane is composed of a material selected from the group consisting of silicon, carbon, boron, silicon nitride, silicon oxide, silicon carbide, boron carbide, and boron nitride.

10. An electron beam projection exposure apparatus as recited in claim 6, further comprising a scanning stage for each filter for scanning said filters in relative syncronism with the scanning of said mask.

11. An electron beam projection exposure apparatus as recited in claim 1, wherein said filter has a flat planar construction.

12. An electron beam projection exposure apparatus as recited in claim 1, further comprising a scanning stage for scanning said filter relative to the scanning of said mask.

* * * * *